United States Patent
Ruile et al.

(10) Patent No.: US 9,455,684 B2
(45) Date of Patent: Sep. 27, 2016

(54) COMPONENT OPERATING WITH ACOUSTIC WAVES AND METHOD FOR PRODUCING SAME

(75) Inventors: Werner Ruile, München (DE); Edgar Schmidhammer, Stein An Der Traun (DE); Ulrike Rösler, Herbertshausen (DE); Stefan Berek, München (DE)

(73) Assignee: EPCOS AG, Munich (DE)

( * ) Notice: Subject to any disclaimer, the term of this patent is extended or adjusted under 35 U.S.C. 154(b) by 539 days.

(21) Appl. No.: 13/985,571

(22) PCT Filed: Feb. 8, 2012

(86) PCT No.: PCT/EP2012/052121
§ 371 (c)(1),
(2), (4) Date: Oct. 22, 2013

(87) PCT Pub. No.: WO2012/110377
PCT Pub. Date: Aug. 23, 2012

(65) Prior Publication Data
US 2014/0035436 A1 Feb. 6, 2014

(30) Foreign Application Priority Data
Feb. 16, 2011 (DE) .................. 10 2011 011 377

(51) Int. Cl.
*H03H 9/25* (2006.01)
*H03H 9/02* (2006.01)
*H03H 9/145* (2006.01)
*H01L 41/047* (2006.01)
*H01L 41/29* (2013.01)

(52) U.S. Cl.
CPC ............. *H03H 9/25* (2013.01); *H01L 41/047* (2013.01); *H01L 41/29* (2013.01); *H03H 9/0222* (2013.01); *H03H 9/14538* (2013.01); *Y10T 29/42* (2015.01)

(58) Field of Classification Search
USPC .............. 310/313 R, 313 A–313 D, 340, 344
See application file for complete search history.

(56) References Cited

U.S. PATENT DOCUMENTS

| | | |
|---|---|---|
| 7,053,523 B1 | 5/2006 | Ballato et al. |
| 7,477,117 B2 | 1/2009 | Pitschi et al. |
| 7,659,653 B2 | 2/2010 | Matsuda et al. |
| 2004/0201306 A1* | 10/2004 | Yamanouchi ...... H03H 9/02653 310/313 B |
| 2005/0057323 A1 | 3/2005 | Kando |
| 2008/0067891 A1 | 3/2008 | Matsuda et al. |
| 2008/0106354 A1 | 5/2008 | Kando |
| 2010/0225202 A1* | 9/2010 | Fukano ................ H03H 9/059 310/313 C |
| 2010/0277036 A1 | 11/2010 | Shimizu et al. |
| 2013/0154763 A1* | 6/2013 | Takamine ............ H03H 9/0085 333/133 |

FOREIGN PATENT DOCUMENTS

| | | |
|---|---|---|
| CN | 1522492 A | 8/2004 |
| CN | 1717620 A | 1/2006 |

(Continued)

*Primary Examiner* — Thomas Dougherty
(74) *Attorney, Agent, or Firm* — McDermott Will & Emery LLP

(57) ABSTRACT

The invention concerns a component (B) operating with acoustic waves, in which the reflection and excitation are largely decoupled. For this purpose, a component comprises a dielectric (DL) which is arranged between an electrode finger (EF) and a piezoelectric substrate (PSU) and at least partially overlaps the electrode finger.

11 Claims, 5 Drawing Sheets

(56) References Cited

FOREIGN PATENT DOCUMENTS

Figure 1:
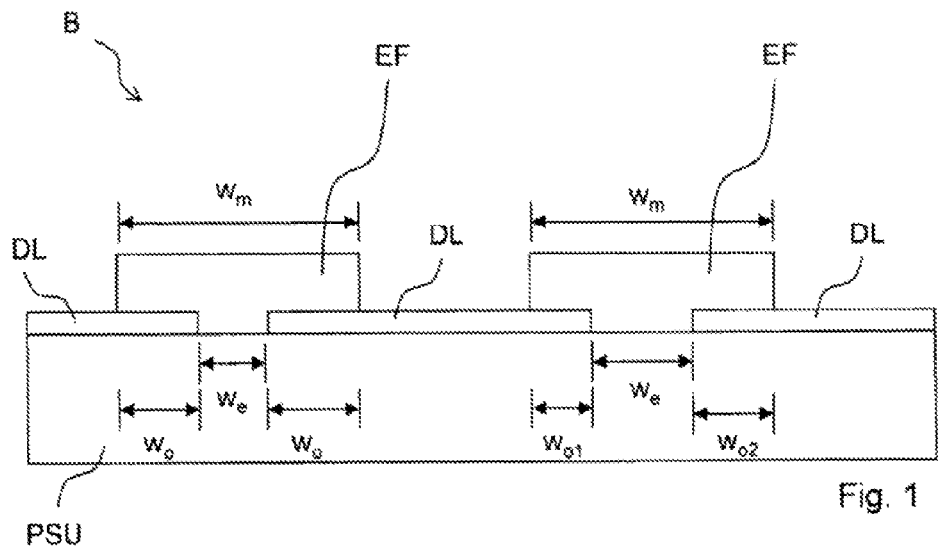

| | | | | |
|---|---|---|---|---|
| CN | 101939911 A | 1/2011 | | |
| EP | 1467484 A2 | 10/2004 | | |
| GB | 12255292 A * | 12/1971 | ........... | B06B 1/0622 |
| JP | 8-307191 | 11/1996 | | |
| JP | 2003332874 A | 11/2003 | | |
| JP | 2004032132 A | 1/2004 | | |
| JP | 2004159262 A | 6/2004 | | |
| JP | 2004312653 A | 11/2004 | | |
| JP | 2006135443 A | 5/2006 | | |
| JP | WO02010-079575 A1 * | 7/2010 | ............. | H03H 9/145 |
| JP | 2013-065940 A * | 4/2013 | ............... | H03H 9/25 |

\* cited by examiner

COMPONENT OPERATING WITH ACOUSTIC WAVES AND METHOD FOR PRODUCING SAME

The invention relates to components operating with acoustic waves and methods for producing same.

Components operating with acoustic waves can convert electrical signals into acoustic waves, and vice versa, on account of the piezoelectric effect. It is thereby possible to form RF filters—for example for telecommunications—from components operating with acoustic waves. For this purpose, the components comprise acoustic resonators. The resonators can operate for example with surface acoustic waves (SAW) or with guided bulk acoustic waves (GBAW). For this purpose, such SAW or GBAW resonators generally comprise electrode fingers which are arranged in an acoustic track and which are arranged on a piezoelectric substrate. Filters comprising resonators operating with acoustic waves are known from U.S. Pat. No. 7,477,117 B2, for example.

Characteristic properties of components operating with acoustic waves, such as, for example, the tendency toward nonlinearities, the suitability for impedance matching, the temperature coefficients of frequency, the power compatibility or the coupling of reflection and excitation of acoustic waves, always merit improvement even for components that otherwise operate satisfactorily.

Therefore, it is an object of the present invention to specify a component operating with acoustic waves wherein these properties are improved. Furthermore, a further object is to specify a method for producing such components.

These objects are achieved by means of the technical teachings of the independent claims. Dependent claims specify advantageous configurations of the invention.

In one embodiment, a component operating with acoustic waves comprises a piezoelectric substrate, a dielectric, and an electrode finger arranged above the substrate and having an overlap region and a mechanical finger width. The dielectric is arranged above the substrate and in the overlap region between the substrate and the electrode finger. The width of the electrode finger defines its mechanical finger width.

In other words, a component operating with acoustic waves is specified in which a dielectric is arranged completely or partly between the electrode finger and the substrate, or the electrode finger bears completely or partly on the dielectric.

The overlap region is defined as that region in which the electrode finger and the dielectric overlap.

The mechanical finger width is defined as the finger width of the electrode finger.

If the electrode finger is completely separated from the piezoelectric substrate by the dielectric, then the electrode finger does not make contact with the piezoelectric substrate in the acoustic track and the overlap region corresponds to the mechanical finger width.

Otherwise, the overlap region is preferably arranged parallel to the electrode finger—that is to say that the top side and the underside of the dielectric are parallel to the top side of the piezoelectric substrate—and at least one part of the electrode finger makes contact with the piezoelectric substrate. The mechanical finger width of the electrode finger then results as the sum of the widths of the overlap region and of the region in which the electrode finger makes contact with the piezoelectric substrate, the contact region. The width of the contact region is also designated hereinafter as electrical finger width.

The propagation of acoustic surfaces or boundary waves in a piezoelectric substrate is influenced by the acoustic impedance in the propagation region and by the electrical conductivity of the electrode fingers. The acoustic impedance is dependent on the mass per unit area and on the stiffness values of the materials used. The relative size of the contact region is relevant to the electrical interaction between structures arranged at the surface of the piezoelectric substrate and acoustic waves. The acoustic impedance is relevant to the mechanical interaction of the acoustic waves with the structures arranged at the surface. By virtue of the fact that the electrical finger width—in contrast to conventional components operating with acoustic waves—now no longer need necessarily be identical to the mechanical finger width, reflection and excitation of acoustic waves are at least partly decoupled. This allows a higher flexibility in the design of components operating with acoustic waves.

Furthermore, the tendency toward nonlinearities is reduced since an electrical finger width that is decreased relative to the mechanical finger width has the effect of reducing the fluctuation of the static capacitance particularly in the case of high wave amplitudes. Furthermore, the static capacitance of the electrode fingers is reduced by the at least partial arrangement of a dielectric between at least one electrode finger and the piezoelectric substrate. An impedance matching of corresponding resonators or filter circuits is improved as a result.

The PZD (PZD=pole zero distance) of a corresponding filter can remain unchanged in this case.

The power compatibility is furthermore improved because the mechanically sensitive region of the electrode, namely the base of the electrode and the corners and edges of the electrode, are mechanically stabilized by the dielectric in the overlap region. In particular a dielectric having high stiffness values brings about a high power compatibility of the electrode and thus also of the component.

A further result of this arrangement comprising electrode finger, dielectric and piezoelectric substrate consists in a reduction of the temperature coefficients of the elastic constants (TCF=temperature coefficients of frequency). The shift in the operating frequencies of corresponding components that is brought about by a temperature change is thereby reduced.

Corresponding components operating with acoustic waves can have an arbitrary number of electrode fingers with arbitrarily configured overlap regions. It is likewise possible for reflector elements that are not interconnected with a busbar to have finger-shaped metallization structures with a corresponding overlap region. The overlap regions can coincide for different electrode fingers and for reflector elements. However, the overlap regions can be configured differently for different electrode fingers and for reflector elements. Preference is given to overlap regions configured in such a way that the electrical finger width thereof is reduced relative to the mechanical finger width. The electrical finger width can also vary transversely or between different electrode fingers. It is also possible for the overlap region to reduce the electrical finger length of an electrode finger, that is to say the length of the contact region of an electrode finger.

In one embodiment, a component operating with acoustic waves comprises a contact region, in which the electrode finger makes contact with the substrate. In this case, the width of the contact region defines the electrical finger width of the electrode finger. Such a component therefore comprises an electrode finger whose overlap region does not correspond to the mechanical finger width. Rather, the mechanical finger width of the electrode finger corresponds to the sum of the widths of the overlap region and of the contact region. The electrical finger width therefore generally differs from the mechanical finger width.

In one embodiment, the electrode finger comprises a contact region, the center of which is shifted relative to the center of the electrode finger.

The center of the contact region is defined as the point from which the contact region extends to the same extent both in the direction of propagation of the acoustic waves and counter to the direction of propagation of the acoustic waves.

The center of the electrode finger is defined as the point from which the mechanical finger width extends to the same extent in the direction of propagation of the acoustic waves and counter to the direction of propagation of the acoustic waves.

In other words: the centroid of the electrical excitation, namely the center of the contact region, is shifted relative to the centroid of the reflection region, namely the center of the mechanical region. As a result of such a shift, particularly if it is present in a plurality of electrode fingers of the component, an excitation weighting can be obtained. As a consequence thereof, a corresponding arrangement of contact and overlap regions enables an asymmetry in the emission of acoustic waves. Unidirectionally emitting transducers can thus readily be obtained.

As a result of the excitation weighting, an SPUDT transducer (SPUDT=single phase unidirectional transducer), for example, can be obtained.

In conventional components operating with acoustic waves, an excitation weighting, namely a phase weighting, is obtained by shifting individual electrode fingers in the direction of propagation or counter to the direction of propagation of the acoustic waves. In this case, the gap positions are shifted in or counter to the direction of propagation. The GAP positions are those positions at which the ends of the electrode fingers and the busbar of the opposite polarity are situated opposite one another, namely the gaps between the electrode fingers and the opposite busbars. The GAP positions are relevant in the design of waveguides. This is because the mass per unit area is reduced at the GAP positions, for which reason the propagation velocity of the acoustic waves differs in comparison with the excitation region, in which electrode fingers are arranged alongside one another. A waveguide can thus be obtained by arranging regions having a changed propagation velocity along the acoustic track.

According to the invention, the finger metallization can substantially remain at an unchanged position on the piezoelectric substrate. A phase weighting can nevertheless be obtained by shifting the contact region. Thus, an excitation weighting can now be obtained without changing the GAP positions and therefore without influencing the waveguide properties of the corresponding component operating with acoustic waves.

In one embodiment, the dielectric layer is recessed in a pit or a depression in the piezoelectric substrate. That has the advantage that the dielectric layer and the substrate in this way can form a common planar surface on which the electrode fingers can then be seated in a plane fashion. On a planar area it is simpler to grow a textured metal layer for the electrode fingers, such that the texturing of the electrode and the associated properties such as e.g. the power strength thereof can be improved with the aid of this embodiment.

In one embodiment, the component comprises a further dielectric, which is arranged in a partial region of the overlap region between the previously designated dielectric and the electrode finger.

The overlap region is still defined as the region in which the electrode finger and a dielectric material above the piezoelectric substrate overlap. The overlap region now comprises a partial overlap region in which the electrode finger makes contact with and overlaps the original dielectric, and a further partial overlap region, in which the electrode finger makes contact with the further dielectric. The further dielectric makes it possible to set the static capacitance of the electrode structure and the acoustic impedance of the electrode structure even more precisely.

In one embodiment, the dielectric constant of at least the one dielectric or a plurality of the dielectrics is less than the dielectric constant of the piezoelectric substrate.

In one embodiment, first or second dielectric comprise independently of one another $SiO_2$ (silicon dioxide), TiN (titanium nitride), $Al_2O_3$ (aluminum oxide), $Ta_2O_5$ (tantalum oxide), HfO, $HfO_2$ (hafnium oxide), or $Si_3N_4$ (silicon nitride). It is also possible for the dielectric to comprise a mixture of these substances or for the component to comprise different dielectrics in different, including dielectric, layers arranged in a manner overlapping or not overlapping one another. The dielectric can be selected with regard to its mechanical stability, which can result in a high power compatibility. It is also possible for the dielectric to be chosen with regard to its acoustic impedance in order to allow improved impedance matching.

In one embodiment, the component comprises a multiplicity of electrode fingers each having a mechanical finger width and an electrical finger width different therefrom.

It is thereby possible to set the respective mechanical finger widths and the respective electrical finger widths individually and in a targeted manner toward specific optimization desires, in order to obtain an optimum component. Standard development tools such as, for example, simulation or modeling software can optimize the specific configuration of the respective electrical and mechanical finger widths and their centroids.

In one embodiment, each electrode finger excites acoustic waves at the top side of the piezoelectric substrate. That is to say that each electrode finger contributes to the conversion between electrical and acoustic signals. For this purpose, each electrode finger comprises a contact region.

In one embodiment, the totality of all the electrode fingers excites acoustic waves at the top side of the substrate. This totality of all the electrode fingers can also comprise non-exciting electrode fingers.

In one embodiment, a component comprises a dielectric layer arranged above every top sides of electrode finger, dielectric and substrate. The totality of the electrode fingers excites, given a sufficient layer thickness of the dielectric, guided bulk acoustic waves (GBAW) at the top side of the substrate.

The dielectric arranged above the electrode fingers can comprise $SiO_2$, for example. The dielectric arranged above the electrode fingers can help to protect and hermetically seal the sensitive electrode structures and to reduce the temperature coefficients of frequency.

The piezoelectric substrate itself can be arranged on a carrier substrate and be deposited e.g. as a layer on the carrier substrate. Such a carrier substrate can comprise e.g. Si (silicon).

A piezoelectric layer can comprise e.g. AlN (aluminum nitride), ZnO (zinc oxide), doped AlN (aluminum nitride) such as AlN doped e.g. with Sc (scandium) or with P (phosphorus).

Furthermore, components are also possible which are stacked one above another and which comprise two or more layer systems operating with acoustic waves, e.g. with guided acoustic waves.

A method for producing a component operating with acoustic waves can comprise the following steps:
providing a piezoelectric substrate or a piezoelectric layer,
forming and structuring a dielectric on the top side of the substrate,
forming and structuring electrode fingers such that regions of individual or a plurality or all of the electrode fingers make contact with the substrate and other regions of the electrode fingers overlap the dielectric.

In other words: a method for producing components operating with acoustic waves is specified in which, during production, a dielectric is arranged at least in sections between electrode fingers and the piezoelectric substrate.

The component is explained in greater detail below on the basis of exemplary embodiments and associated schematic figures.

Figure 2:
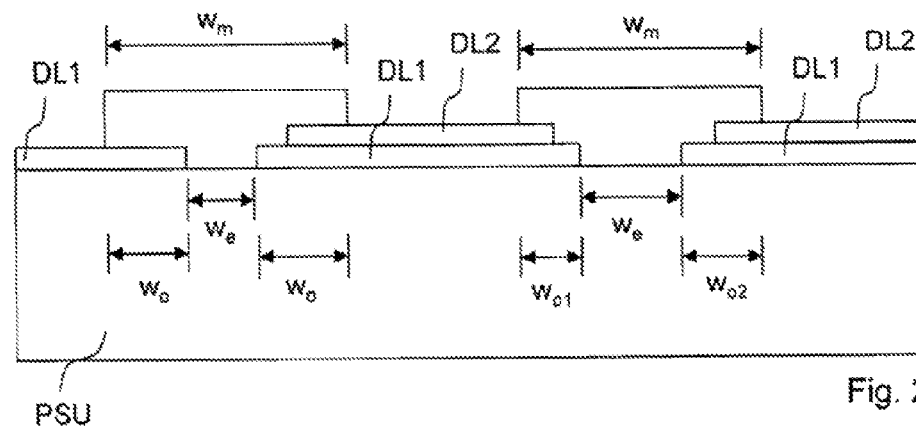
Figure 3A:
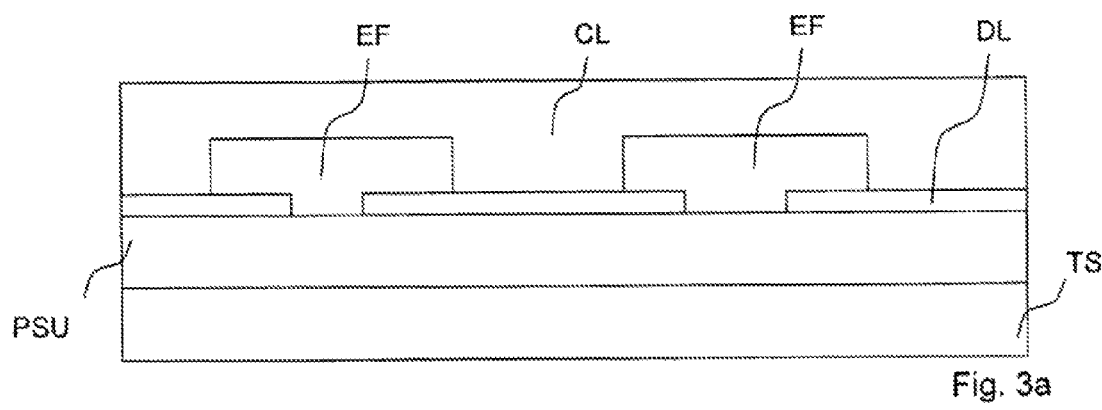
Figure 3B:
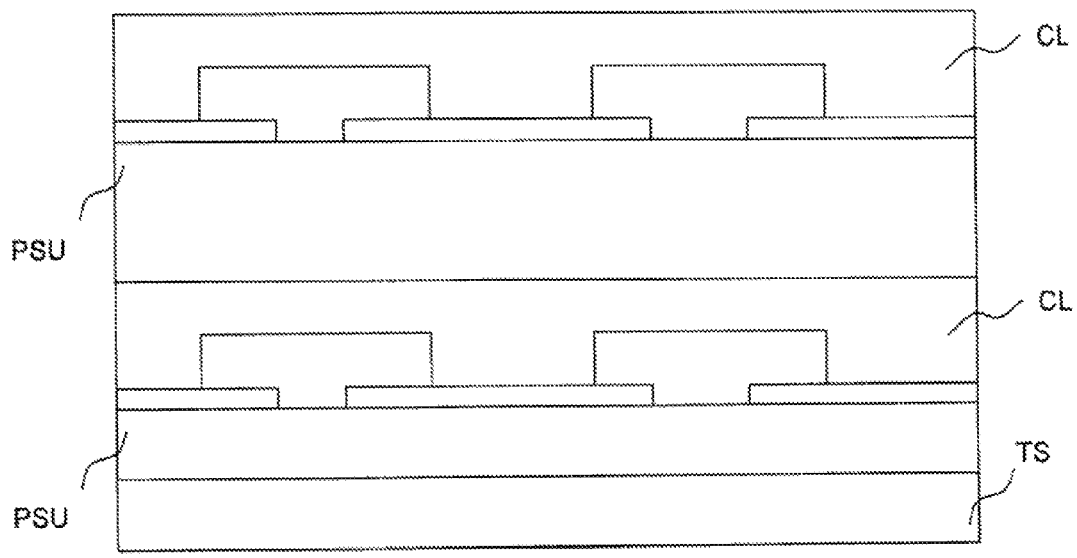
Figure 4:
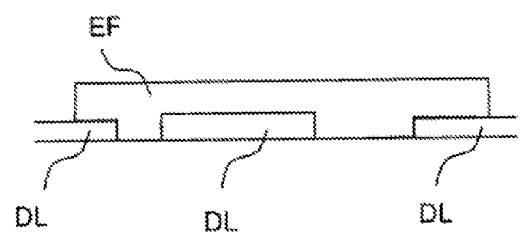
Figure 5:
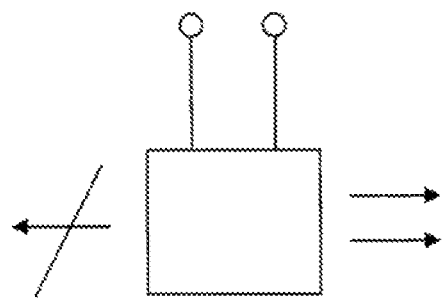
Figure 6A:
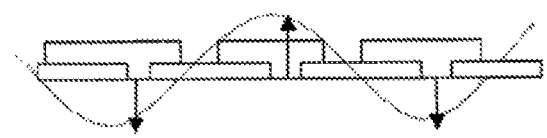
Figure 6B:
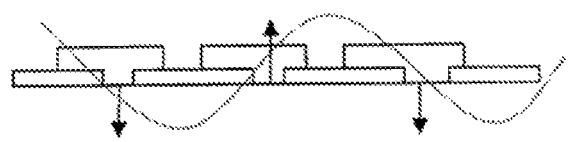
Figure 6C:
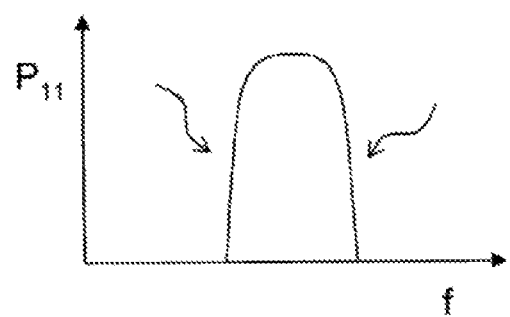
Figure 7:
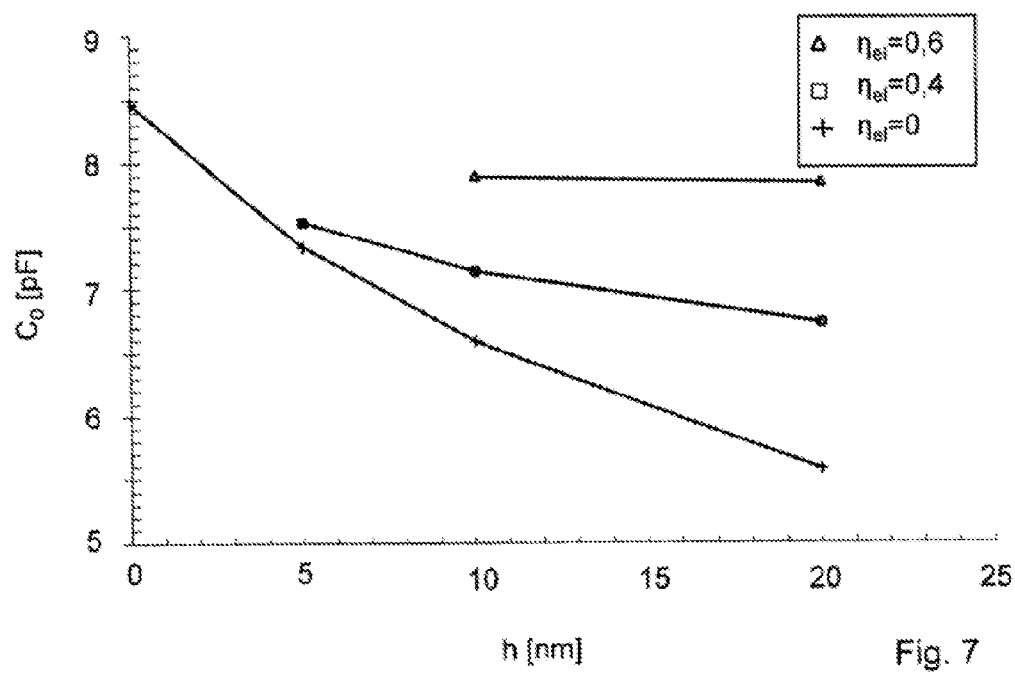
Figure 8:
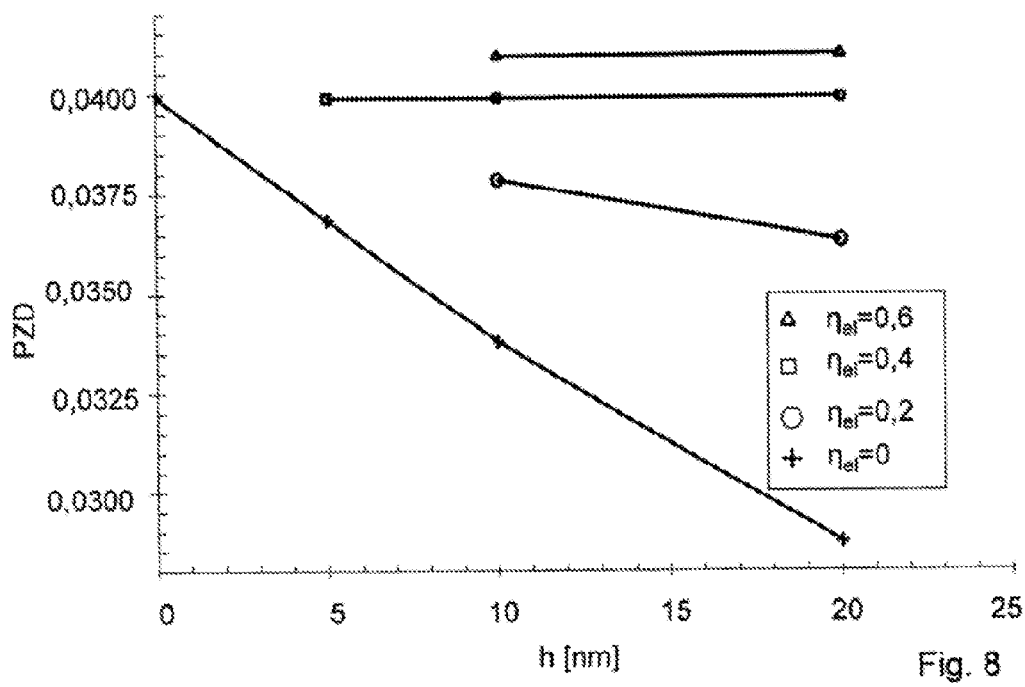
Figure 9:
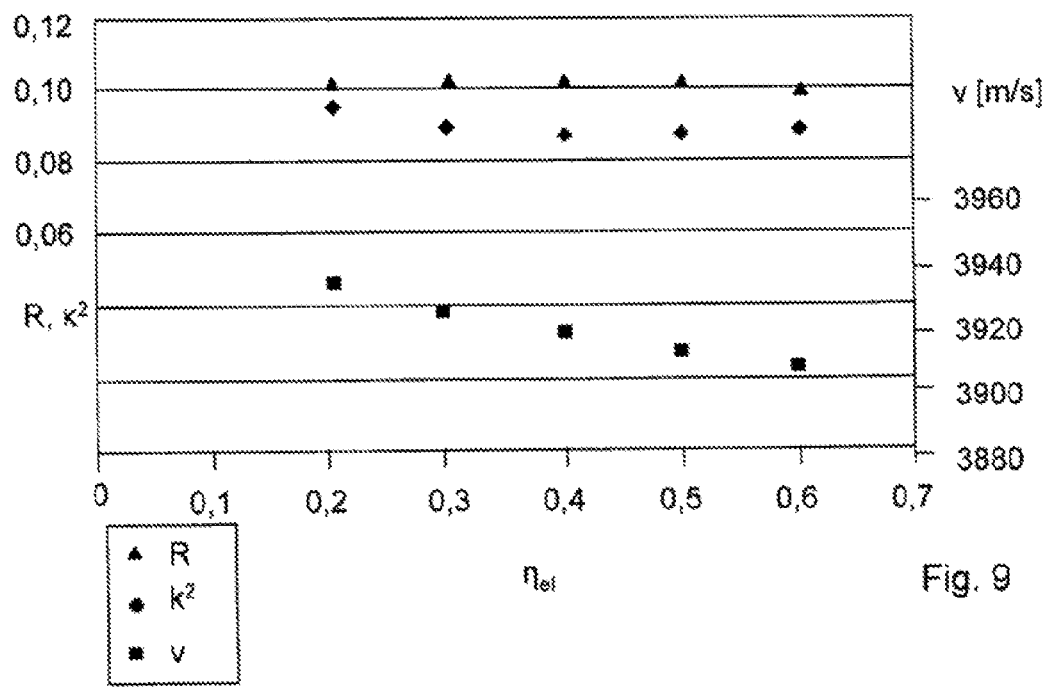
Figure 10:
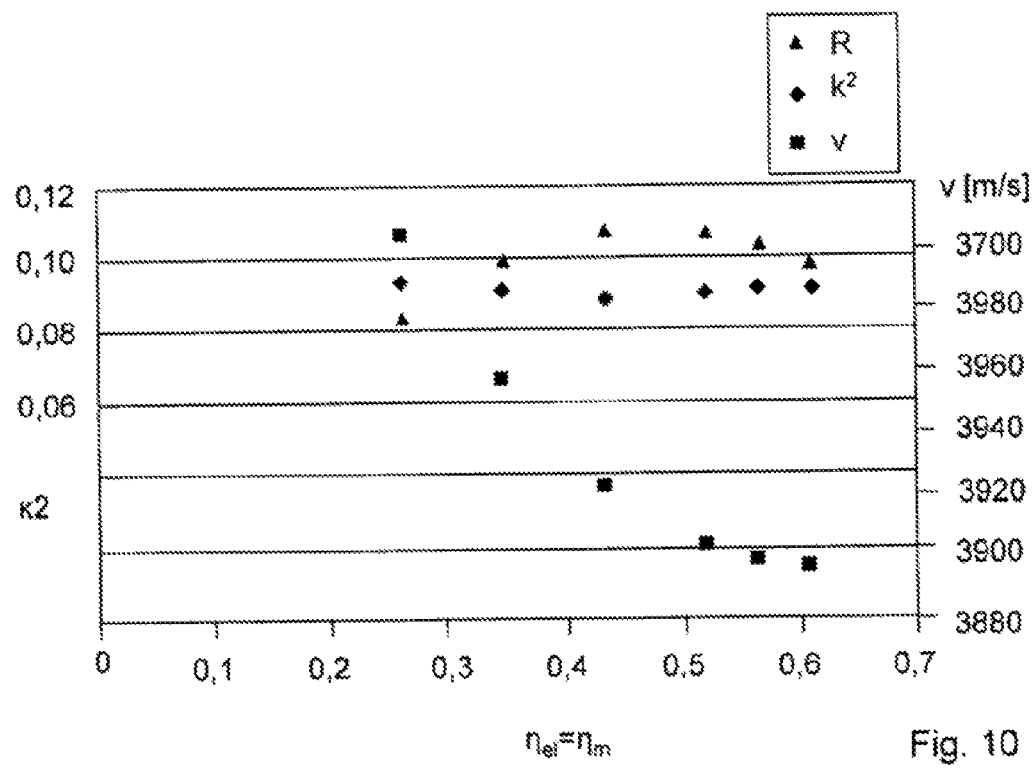

In the figures:

FIG. 1 shows: a sagittal section through a component comprising two electrode fingers, a dielectric material and a piezoelectric substrate, and FIG. 2 shows: a sagittal section through a component comprising two dielectric layers, FIGS. 3a, 3b show: a sagittal section through a component comprising a dielectric cover layer, FIG. 4 shows: a sagittal section through an electrode finger with two contact regions, FIG. 5 shows: a unidirectionally emitting transducer, FIGS. 6a, 6b, 6c show: how the contact regions are to be configured in order to excite frequencies of the passband or stop-band edges, FIG. 7 shows: thickness-dependent static capacitances for different electrical finger widths, FIG. 8 shows: the thickness-dependent pole zero distance for different electrical finger widths, FIG. 9 shows: the electroacoustic coupling coefficient (left scale) as a function of the electrical finger width and the propagation velocity (right scale) as a function of the mechanical finger width, and the reflection coefficient (left scale) as a function of the mechanical finger width, FIG. 10 shows: the electroacoustic coupling coefficient $k^2$ (left scale) as a function of the mechanical finger width, the reflection coefficient (left scale) as a function of the mechanical finger width, and the propagation velocity (right scale) as a function of the electrical finger width.

FIG. 1 shows a sagittal section through a component B operating with acoustic waves and comprising two electrode fingers EF. The sagittal section shows a plane that is parallel to the direction of propagation of the acoustic waves and perpendicular to the plane of the electrode fingers EF. The electrode fingers EF are arranged on and above a piezoelectric substrate PSU. In a respective contact region having the width $w_e$, the electrical finger width, the electrode finger EF makes contact with the piezoelectric substrate PSU. In an overlap region, a dielectric in the form of the dielectric layer DL is arranged between an electrode finger EF and the piezoelectric substrate PSU. In this case, each of the two fingers shown in FIG. 1 has an overlap region divided into two parts. In this case, the contact region divides the overlap region. The width of the overlap region, which is not continuous in this case, is defined as the sum of the widths of all the partial regions of the overlap region. The widths of the sections of the overlap region are designated by $w_o$, $w_{o1}$ and $w_{o2}$. The widths of the partial regions of an overlap region of an electrode finger can be different or identical.

The mechanical finger width $w_m$, is determined by the finger width of the corresponding electrode fingers EF.

By virtue of the fact that the electrical finger widths $w_e$ differ from the mechanical finger widths $w_m$, the excitation and the reflection of acoustic waves can be decoupled.

FIG. 2 likewise shows a sagittal section through a component operating with acoustic waves. In addition to the embodiment shown in FIG. 1, the component shown in FIG. 2 comprises a further dielectric layer DL2 composed of a further dielectric. The material of the second dielectric can differ from the material of the dielectric layer DL1. However, both layers DL1 and DL2 can also comprise the same material.

As a result, the number of degrees of freedom in the formation of the overlap region is increased. Desired acoustic and electrical properties can be set more precisely as a result.

FIG. 3a shows a sagittal section through a component operating with acoustic waves, wherein all top sides of the electrode fingers EF and of the dielectric layer DL are covered by a cover layer CL. Consequently, a GBAW component is obtained and the generally sensitive electrode fingers EF are hermetically encapsulated and protected against mechanical damage. The piezoelectric substrate PSU is realized as a piezoelectric layer arranged on a carrier substrate TS. Such a layer can be obtained e.g. by sputtering.

FIG. 3b shows a component comprising two layer systems operating with acoustic waves and arranged one above the other. The piezoelectric substrate of the upper layer system is arranged in the form of a piezoelectric layer on the dielectric cover layer CL of the lower layer system. A very high integration density is obtained by virtue of such a stack.

FIG. 4 shows a sagittal section through an electrode finger having two contact regions and three overlap regions.

In principle, as many contact regions and overlap regions as desired are conceivable. It is thereby possible, for example, to set the weighting of an electrode finger individually and very precisely.

FIG. 5 shows a unidirectionally (here: toward the right) emitting transducer. An asymmetry of the contact regions or of the overlap regions can bring about e.g. a unidirectional emission characteristic.

FIG. 6a schematically shows oscillation maxima—aligned with the mechanical finger widths—of an acoustic wave, symbolized by a dashed curve: the position of the centers of the mechanical finger width corresponds to the position of the oscillation antinodes of the acoustic wave. The centers of the electrical excitation, defined by the position of the contact regions and symbolized by arrows, are shifted relative to the centers of the mechanical finger widths. In comparison therewith, FIG. 6b shows a transducer in which the positions of the centers of the mechanical finger width coincide with the positions of the oscillation nodes of the acoustic wave.

In both cases, an excitation or damping of the acoustic wave is possible at frequencies which are not the center frequencies of a corresponding RF filter. It is therefore possible to influence frequency components of the passband or stop-band edges, shown in FIG. 6c, of the RF filters in a targeted manner. It is therefore possible, in particular, to influence frequency components of the lower and upper passband or stop-band edges in a targeted manner. Correspondingly designed components can therefore dispense with complex measures for modeling the edges.

This shows that the mechanical influence of the finger metallization on the acoustic wave can be decoupled from the electrical influence of the metallization on the wave. The respective phase differences between a periodic mass per unit area and the wave, on the one hand, and between the electrical excitation and the wave, on the other hand, can be set independently of one another to values that meet specific requirements.

FIG. 7 shows the dependence of the static capacitance $C_0$ on the thickness h of the dielectric which overlaps the electrode finger in the overlap region. The values marked by a plus sign denote an electrode finger having a vanishing electrical finger width $w_{e1}$. That means that the electrode finger completely overlaps the dielectric.

The metallization ratio η of a transducer is the quotient of finger width w and the geometrical pitch p of the transducer: η=w/p. The geometrical pitch is substantially the distance between the centers of adjacent electrode fingers and thus corresponds to half the wavelength λ/2. If the mechanical finger width and the electrical finger width differ, then the corresponding metallization ratios also differ: $η_{e1}=w_{e1}/P$, $η_m=w_m/p$.

The static capacitances $C_0$ in the case of an electrical metallization ratio of 0.4 are identified by squares.

The static capacitances $C_0$ of a component having an electrical metallization ratio of 0.6 are identified by triangles.

The greater the electrical finger width, the less pronounced the dependence of the static capacitances $C_0$ on the layer thickness of the dielectric h.

FIG. 7 relates to an electroacoustic transducer having 150 finger pairs, an aperture of 25λ and a mechanical metallization ratio η of 0.65.

The dependence of the capacitance on the thickness h of the dielectric layer DL as shown in FIG. 7 is more highly pronounced, the lower the electrical metallization ratio $η_{e1}$. The dependence is maximal for a vanishing electrical metallization ratio $η_{e1}=0$. This dependence decreases greatly as the electrical metallization ratio $η_{e1}$ rises. With a sufficiently high electrical metallization ratio $η_{e1}$, a sufficiently stable capacitance $C_0$ can be established even in the case of a layer thickness h that fluctuates in a manner governed by production.

Nevertheless, it is furthermore possible to obtain sufficiently low capacitances $C_0$ with a correspondingly chosen layer thickness h. It is possible, for example, to obtain a capacitance of 7.6 pF in the case of an electrical metallization ratio of $η_{e1}=0.4$ and a layer thickness of h=5 nm.

FIG. 8 shows the PZD (pole zero distance, see above) for the normalized electrical finger widths 0 (identified by a plus sign), 0.2 (identified by circles), 0.4 (identified by squares) and 0.6 (identified by triangles), in each case in units of the geometrical pitch p. In this case, FIG. 8 shows the values for an LT42YX substrate. LT42YX denotes a substrate composed of LiTaO$_3$ (lithium tantalate) having the Eulerian angles (180°, 48°, 180°) in accordance with the international standard according to IEC62276 (IEC=International Electrotechnical Commission).

Starting from an electrical finger width of more than 0.2, the PZD is practically no longer dependent on the layer thickness h of the dielectric. As a result, the PZD is substantially independent of manufacturing fluctuations during the production of the dielectric layer.

Furthermore, it has surprisingly been found that the PZD starting from $η_{e1}=0.4$ is practically not reduced compared with a conventional transducer without a dielectric layer. This is noticeable because the static capacitance $C_0$ is significantly reduced.

It can be concluded that despite lower electrical charge accumulated on the surface of the electrode finger, an acoustic excitation of similar strength in comparison with conventional transducers takes place.

Since a lower static capacitance $C_0$ suffices for an improved component, the adaptability to an external real load resistance is improved.

The triangles in FIG. 9 show the reflection coefficient (left scale) as a function of the electrical metallization ratio $η_{e1}$, which is dependent on the electrical finger width $w_{e1}$ and the geometrical pitch P: $η_{e1}=w_{e1}/p$. The diamonds identify the electroacoustic coupling coefficient $k^2$ (likewise plotted on the left scale), which depends only insignificantly on the electrical finger width. The horizontally oriented squares identify the acoustic propagation velocity v (right scale) as a function of the electrical metallization ratio $η_{e1}$.

FIG. 9 relates to a transducer in which the electrode fingers have an overlap region having a width >0 and a mechanical metallization ratio $η_m=0.65p$.

FIG. 10 shows the analogous values for a reference structure without a dielectric layer between the electrode fingers and the piezoelectric substrate, i.e. without an overlap region.

It can clearly be discerned that the absolute values of the velocity, of the reflection coefficient and of the coupling coefficient are substantially similar for both structures, but that the dependence on the mechanical finger width, that is to say on the metallization ratio η, is more highly pronounced in the case of the reference structure.

That means that a component according to the invention is not adversely affected with regard to reflection, coupling coefficient and wave velocity.

The excitation substantially corresponds to the Fourier transform of the charge distribution. By virtue of the fact that the charge distribution can be varied by setting the overlap region, without substantially changing the reflection behavior, a further degree of freedom is obtained in the setting of the excitation.

A component operating with acoustic waves according to the invention is not restricted to one of the exemplary embodiments described. Combinations thereof and variations which comprise, for example, even further reflective or exciting dielectric or metallic structures or further dielectric layers likewise constitute exemplary embodiments according to the invention.

LIST OF REFERENCE SIGNS

B: component operating with acoustic waves
C0: static capacitance
CL: dielectric cover layer
DL: dielectric layer
DL1, DL2: dielectric layers
EF: electrode finger
h: thickness of the dielectric layer
PSU: piezoelectric substrate
PZD: pole zero distance
TS: carrier substrate
v: propagation velocity
$w_e$: electrical finger width
$w_m$: width/mechanical finger width
$w_o$, $w_{o1}$, $w_{o2}$: section of the overlap region
η: metallization ratio
k2: electroacoustic coupling coefficient

The invention claimed is:

1. A component operating with acoustic waves, comprising:
   a piezoelectric substrate;
   a dielectric;
   an electrode finger arranged above the substrate and having an overlap region with the dielectric and a mechanical finger width;
   a contact region, in which the electrode finger makes contact with the substrate; and
   a further dielectric,
   wherein the dielectric is arranged above the substrate and in the overlap region between the substrate and the electrode finger,
   wherein the width of the electrode finger defines the mechanical finger width of the electrode finger,
   wherein the width of the contact region defines the electrical finger width of the electrode finger, and
   wherein the further dielectric is arranged in a partial overlap region between the dielectric and the electrode finger.

2. The component according to claim 1, wherein the electrode finger has a contact region and the center of the contact region is shifted relative to the center of the electrode finger.

3. The component according to claim 1, wherein the dielectric constant of the dielectric is less than the dielectric constant of the piezoelectric substrate.

4. The component according to claim 1, wherein the dielectric comprises $SiO_2$, TiN, $Al_2O_3$, $Ta_2O_5$, HfO, $HfO_2$, or $Si_3N_4$.

5. The component according to claim 1, further comprising a multiplicity of electrode fingers each having a mechanical finger width and an electrical finger width different therefrom.

6. The component according to claim 5, wherein each of the electrode fingers excites acoustic waves at the top side of the substrate.

7. The component according to claim 5, further comprising a dielectric cover layer arranged above each top side of electrode finger, dielectric and substrate, wherein the totality of the electrode fingers excites guided bulk acoustic waves at the top side of the substrate.

8. A component operating with acoustic waves, comprising:
   a piezoelectric substrate;
   a dielectric; and
   an electrode finger arranged above the substrate and having an overlap region with the dielectric and a mechanical finger width,
   wherein the dielectric is arranged above the substrate and in the overlap region between the substrate and the electrode finger,
   wherein the width of the electrode finger defines the mechanical finger width of the electrode finger,
   wherein at least the dielectric is arranged in a depression at the surface of the piezoelectric substrate, and
   wherein the surfaces of the dielectric and of the substrate form a common plane in a contact region in which the electrode finger makes contact with the substrate.

9. The component according to claim 1, wherein the piezoelectric substrate is a layer applied on a carrier substrate.

10. The component according to claim 1, comprising two or more layer systems each operating with acoustic waves and arranged one above another.

11. A method for producing a component operating with acoustic waves, comprising the following steps:
   providing a piezoelectric substrate;
   forming and structuring a dielectric on the top side of the substrate; and
   forming and structuring at least one electrode finger such that regions of individual or a plurality or all of the at least one electrode finger make contact with the substrate and other regions of the electrode fingers overlap the dielectrics;
   providing a contact region, in which the at least one electrode finger makes contact with the substrate, wherein the width of the contact region defines the at least one electrical finger width of the electrode finger; and
   providing a further dielectric, wherein the further dielectric is arranged in a partial overlap region between the dielectric and the at least one electrode finger.

* * * * *